(12) United States Patent
Lee et al.

(10) Patent No.: US 10,171,104 B1
(45) Date of Patent: Jan. 1, 2019

(54) ENCODING VARIABLE LENGTH INTEGERS FOR GRAPH COMPRESSION

(71) Applicant: International Business Machines Corporation, Armonk, NY (US)

(72) Inventors: Jinho Lee, Austin, TX (US); Ying Liu, Austin, TX (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/807,366

(22) Filed: Nov. 8, 2017

(51) Int. Cl.
| | |
|---|---|
| *G06F 8/41* | (2018.01) |
| *H03M 7/30* | (2006.01) |
| *H03M 7/42* | (2006.01) |
| *G06F 17/30* | (2006.01) |
| *H04L 29/06* | (2006.01) |
| *H04N 19/91* | (2014.01) |

(52) U.S. Cl.
CPC ...... *H03M 7/425* (2013.01); *G06F 17/30371* (2013.01); *H04N 19/91* (2014.11); *G06F 8/4434* (2013.01); *H03M 7/6017* (2013.01); *H04L 69/02* (2013.01)

(58) Field of Classification Search
CPC .................. H03M 7/425; H03M 7/601; G06F 17/30371; G06F 8/4434; H04N 19/91; H04L 69/02
USPC ...................................................... 341/65, 67
See application file for complete search history.

(56) References Cited

U.S. PATENT DOCUMENTS

| 6,873,324 | B2 * | 3/2005 | Saito ........................ G06K 9/48 |
|---|---|---|---|
| | | | 345/419 |
| 7,148,821 | B2 | 12/2006 | Thirumoorthy |
| 7,205,915 | B2 | 4/2007 | Zheltov et al. |
| 7,652,596 | B1 | 1/2010 | Sharma et al. |
| 7,747,994 | B1 | 6/2010 | Yang |
| 7,965,207 | B2 | 6/2011 | Hendrickson |
| 8,482,441 | B2 * | 7/2013 | Medard ............... H03M 7/3057 |
| | | | 341/106 |
| 8,942,502 | B2 | 1/2015 | Singh et al. |
| 2008/0256332 | A1 | 10/2008 | Fuin |
| 2010/0219991 | A1 | 9/2010 | Tang |
| 2015/0180506 | A1 | 6/2015 | Wee |
| 2015/0312379 | A1 | 10/2015 | Lusk et al. |

(Continued)

OTHER PUBLICATIONS

Alcubilla, Joglar Javier; "Leveling: An Efficient VLC for Lossless Data Compression", International Journal of Signal Processing, vol. 9, No. 3, Mar. 2016, pp. 199-218.

(Continued)

*Primary Examiner* — Khai M Nguyen
(74) *Attorney, Agent, or Firm* — Cantor Colburn LLP; Mercedes Hobson

(57) ABSTRACT

A graph compression system includes a memory unit to store graph data, and an electronic hardware controller in signal communication with the memory unit. The electronic hardware controller determines a distribution of a set of vertices in a graph, and encodes each vertex included in the set of vertices as a variable length integer (VLI) that includes a variable number of bytes. The variable number of bytes of each vertex is based on the determined distribution. Accordingly, the memory unit stores each vertex having been encoded according to the distribution of the set of vertices in the graph.

20 Claims, 6 Drawing Sheets

(56) References Cited

U.S. PATENT DOCUMENTS

2016/0226517 A1    8/2016  Khemani
2016/0301422 A1   10/2016  Ahmed et al.

OTHER PUBLICATIONS

Hu et al.; "An Improved VLC-Based Lossless Data Hiding Scheme for JPEG Images", The Journal of Systems and Software, vol. 86, Iss. 8, Aug. 2013, pp. 2166-2173.
Kolo et al.; "Performance Comparison of Data . . . Sensor Networks", International Journal of Computer Applications in Technology, vol. 46, No. 1, Jan. 2013, pp. 65-75.
Raja et al.; "A New Variable-Length Integer Code for Integer . . . Text Compression", Indian Journal of Science and Technology, vol. 8, Issue 24, Sep. 2015, pp. 1-6.

\* cited by examiner

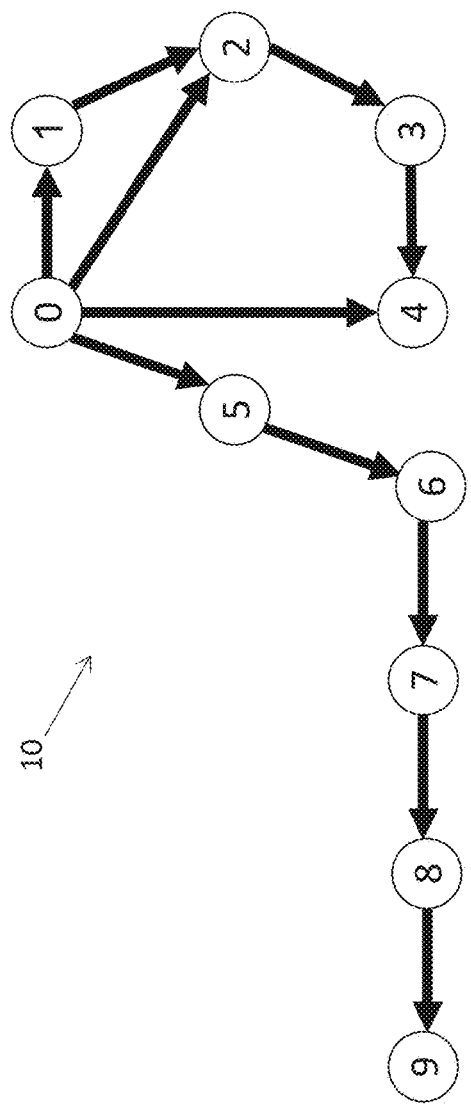

| Integer | $\gamma = \zeta_1$ |
|---|---|
| 1 | 1 |
| 2 | 010 |
| 3 | 011 |
| 4 | 00100 |
| 5 | 00101 |
| 6 | 00110 |
| 7 | 00111 |
| 8 | 0001000 |
| 9 | 0001001 |
| 10 | 0001010 |
| 11 | 0001011 |
| 12 | 0001100 |
| 13 | 0001101 |
| 14 | 0001110 |
| 15 | 0001111 |

Encoded vertex 2 = prefix (0) + binary value 2 (10) = 010, where the prefix length = binary length − 1;
=> prefix length = 2(i.e., 10) −1 = 1 prefix 0

Encoded vertex 8 = prefix (000) + binary value 8 (1000) = 0001000, where the prefix length = binary length − 1 = 3 prefix zeros
=> prefix length = 4(i.e., 1000) −1 = 3 prefix zeros

FIG. 3

ENCODING VARIABLE LENGTH INTEGERS FOR GRAPH COMPRESSION

BACKGROUND

The present invention generally relates to large-scale graph processing, and more specifically, to data compression of large-scale graphs.

Graph processing is an analytics tool that is widely used in big-data processing. Large-scale graph processing typically involves several algorithms that perform relationship analysis of various entities, data mining, and various optimization problems. For example, modern computer processing techniques typically employ a "graph traversal" algorithm which can be applied to a variety of technical fields, including social networks, web-based applications, website user-click analysis, business analytics, and high-performance computing. The graph traversal algorithm determines one or more vertices, and the relationship of each vertex with respect to one or more neighboring vertices is typically referred to as "neighbors". The graph is then represented as binary code or set of binary numbers. However, a graph representing a given relationship can contain tens of thousands of vertices, and each vertex can include thousands of addition neighbors. Therefore, the ability to scale out the graph traversal to very large systems can be severely limited by the capability of the controller and/or memory to processes the binary data.

Compression operations have been employed in computing systems to code and compress the binary data representing the graph. For instance, compression symbol identification can help reduce this communication and improve the execution time of graph traversal and thus improve overall processor timing and throughput. The Boldi-Vigna (BV) algorithm is a compression algorithm typically employed to compress large-scale graphs. The BV algorithm utilizes differential coding and variable length integers (VLIs) to reduce the binary values that represent the vertices and neighbors of a given graph. The VLI coding scheme can provide efficient compression, assuming that smaller binary values assigned to a particular vertex or neighbor appear more frequently in a given distribution. This assumption, however, is not necessarily true in all large-scale graph applications such as, for example, web graphs and social networking graphs. Consequently, there is a need for an improved large-scale graph compression technique.

SUMMARY

According to at least one non-limiting embodiment, a graph compression system comprises a memory unit configured to store graph data, and an electronic hardware controller in signal communication with the memory unit. The electronic hardware controller is configured to determine a distribution of a set of vertices in a graph, and to encode each vertex included in the set of vertices as a variable length integer (VLI) that includes a variable number of bytes. The variable number of bytes of each vertex is based on the determined distribution, and the memory unit stores each encoded vertex.

According to another non-limiting embodiment, a method of compressing a graph is provided. The method comprises determining a distribution of a set of vertices in a graph, and encoding each vertex in the set of vertices defining the graph as a variable length integer (VLI) that includes a variable number of bytes. The method further includes storing each encoded vertex in a memory unit, the variable number of bytes of each vertex based on the determined distribution.

According to yet another non-limiting embodiment, a computer program product controls an electronic device to compress graph data. The computer program product comprises a computer readable storage medium having program instructions embodied therewith. The program instructions are executable by an electronic computer processor to control the electronic device to perform a method comprising determining a distribution of a set of vertices in a graph represented by the graph data, and encoding each vertex in the set of vertices defining the graph as a variable length integer (VLI) that includes a variable number of bytes. The method further comprises storing each encoded vertex in a memory unit, where the variable number of bytes of each vertex is based on the determined distribution.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 illustrates an outward graph including a neighborhood of vertices;

FIG. 2 is an example of a vertex-neighbor list table listing the neighbors (v) of a given vertex (V);

FIG. 3 depicts a conventional VLI encoding table;

Figure 4:
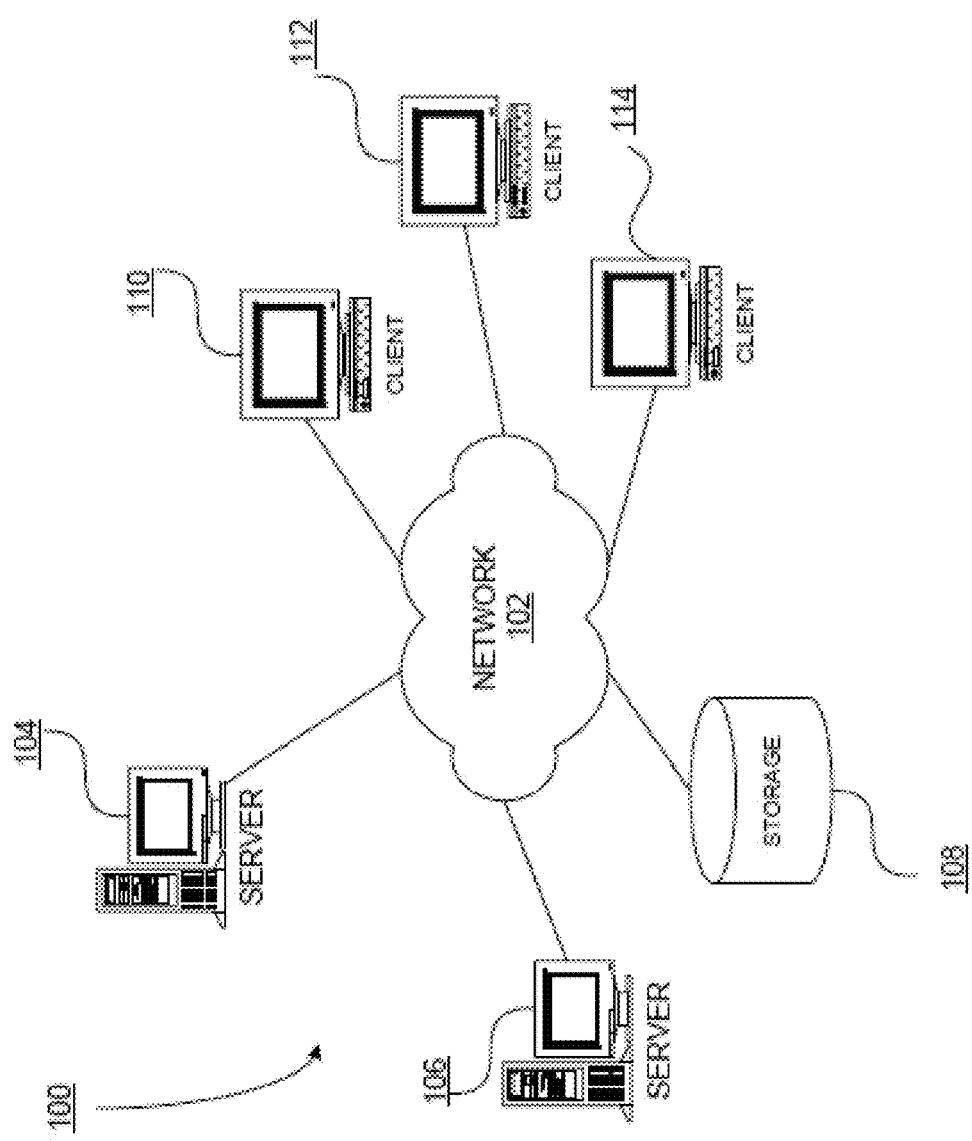
FIG. 4 depicts block diagram of an exemplary network data processing system operable for various embodiments of the disclosure.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, the BV coding algorithm employed by conventional large-scale graph compression schemes represents each vertex in a known distribution as a binary value, and then assigns a binary prefix to each binary value, which serves as an index to the vertex. FIG. 1 illustrates an outward graph |V| 10 including vertices (V) 0-9, and FIG. 2 is a graph neighborhood table 20 listing the outward "neighbors" (v) of each vertex (V). A "neighbor" is referred to one or more vertices (v) that are directly adjacent to a given vertex (V). The total number of neighbors corresponding to a given vertex (V) is sometimes referred to as "the neighborhood" of the vertex (V). For instance, vertex (V) 0 is directly adjacent to vertices 1, 2, 4 and 5, but not adjacent to vertices 3, 6, 7, 8 and 9. Thus, the outward neighbors (v) of the vertex (V) 0 are listed in table 20 as neighbors (v) 1, 2, 4 and 5. In other words, vertex 0 ($V_O$) has a neighborhood $|v_O|$ defined as 1, 2, 4 and 5. The total number of neighbors corresponding to a given vertex (V) is referred to as the "degree" (D) of the vertex.

As described above, the conventional VLI coding scheme may not provide efficient compression in all large-scale graph applications such as, for example, web graphs and social networking graphs. More specifically, a conventional VLI scheme utilizes a pre-fix length of a given vertex binary value according to a static or fixed formula, where the pre-fix length=N−1 of the binary value. Consequently, if the binary value is large, the pre-fix length must also be large. Referring to a conventional VLI encoding table depicted in FIG. 3, for example, a vertex value of "2" is encoded as "010", where the vertex value "2" is represented as the binary value "01", and is encoded with a binary prefix of "0". However, the vertex value of "8" is encoded as "0001000", where the vertex value 8 is represented as the binary value "1000", and is encoded with a binary prefix of "000". Because the conventional VLI coding scheme is pre-fixed (i.e., directly depends on the value of the vertex), a large encoded value is generated even when smaller values appear less frequency. That is, smaller pre-fix lengths are always reserved for smaller vertex values, even if these smaller vertex values are not used. Consequently, the conventional VLI coding scheme may result in reduced decompression speeds, along with increases in the amount of data obtained from storage.

Turning now to an overview of the aspects of the invention, one or more embodiments of the invention address the above-described shortcomings of the prior art by providing a graph compression system which implements an enhanced VLI encoding scheme that improves large-scale graph compression efficiency. The enhanced VLI scheme takes into account the degree of a given vertex binary value to determine the pre-fix length. The degree indicates the frequency at which a given binary value appears in a distribution set. The binary pre-fix length is then assigned according to the frequency of a given vertex binary value. Thus, the length of the pre-fix is independent of the length of the vertex binary value. In other words, a large vertex binary value is not required to have a large prefix binary length. Accordingly, the compression efficiency of the graph is improved (e.g., 10%-20% improvement) because extraneous bits can be eliminated from the prefix length. In this manner, memory space can be reduced and computing performance speed can be increased.

With respect to FIG. 4, a network of data processing systems capable of performing a large-scale graph compression scheme is illustrated according to a non-limiting embodiment. The network data processing system 100 contains a network of computers in which the illustrative embodiments may be implemented. In at least one example, the network data processing system 100 includes network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 4 is intended as an example, and not as an architectural limitation for the different illustrative embodiments.

Figure 5:
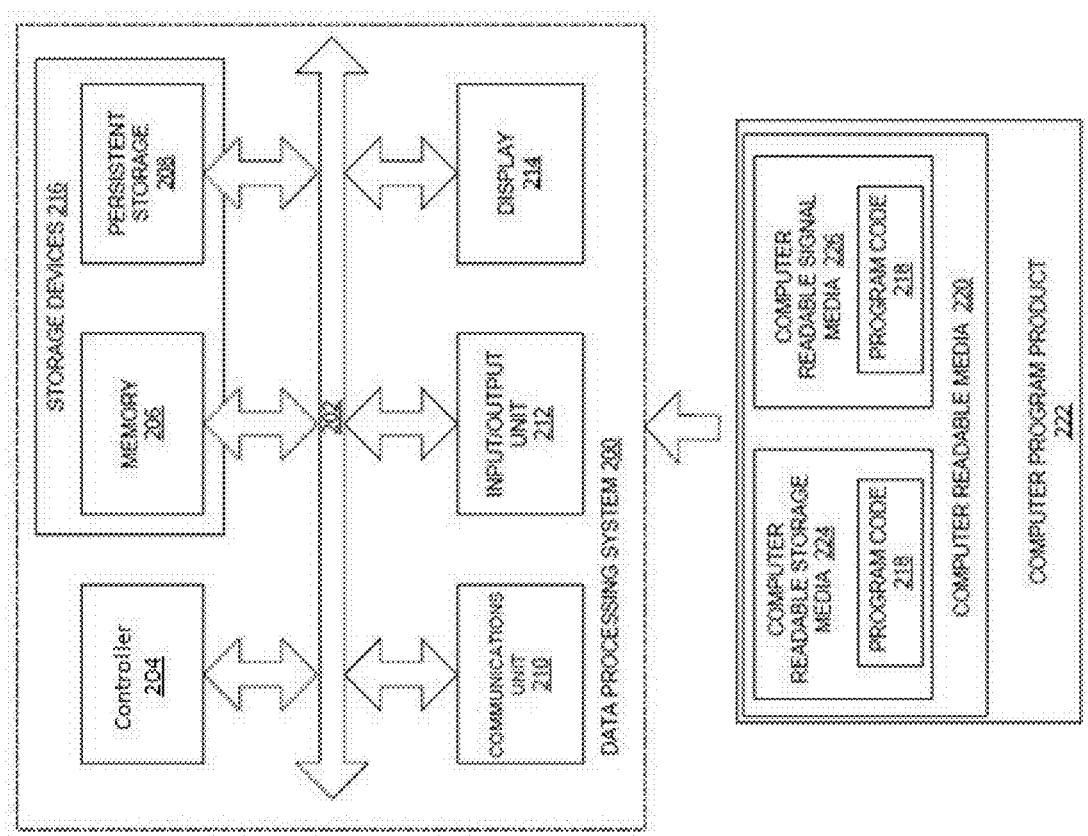
FIG. 5 is a block diagram of an exemplary data processing system operable for various embodiments of the disclosure.

With reference to FIG. 5, a block diagram of an exemplary data processing system operable according to one or more non-limiting embodiments is illustrated. In this illustrative example, data processing system 200 includes communications fabric 202, which provides communications between hardware controller 204, memory 206, persistent storage 208, communications unit 210, input/output (I/O) unit 212, and display 214.

Controller 204 serves to execute instructions for software that may be loaded into memory 206. Controller 204 may be a set of one or more processors or may be a multi-processor core, depending on the particular implementation. Further, controller 204 may be implemented using one or more heterogeneous processor systems in which the main processor is present with secondary processors on a single chip. As another illustrative example, controller 204 may be a symmetric multi-processor system containing multiple processors of the same type.

Memory 206 and persistent storage 208 are examples of storage devices 216. A storage device is any piece of hardware that is capable of storing information, such as, for example without limitation, data, program code in functional form, and/or other suitable information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications and/or programs may be located in storage devices 216, which are in communication with controller 204 through communications fabric 202. In these illustrative examples, the instructions are in a functional form on persistent storage 208. These instructions may be loaded into memory 206 for execution by controller 204. The processes of the different embodiments may be performed by controller 204 using computer-implemented instructions, which may be located in a memory, such as memory 206.

These instructions are referred to as program code, computer usable program code, or computer readable program code that may be read and executed by a processor in controller 204. The program code in the different embodiments may be embodied on different physical or tangible computer readable storage media, such as memory 206 or persistent storage 208.

Program code 218 is located in a functional form on computer readable storage media 220 that is selectively removable and may be loaded onto or transferred to data processing system 200 for execution by controller 204. Program code 218 and computer readable storage media 220 form computer program product 222 in these examples. In one example, computer readable storage media 220 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable storage media 220 also may take the form of a persistent storage, such as a hard drive, a thumb drive, or a flash memory that is connected to data processing system 200. The tangible form of computer readable storage media 220 is also referred to as computer recordable storage media. In some instances, computer readable storage media 220 may not be removable.

Alternatively, program code 218 may be transferred to data processing system 200 from computer readable storage media 220 through a communications link to communications unit 210 and/or through a connection to input/output unit 212. The communications link and/or the connection may be physical or wireless in the illustrative examples. The computer readable media also may take the form of non-tangible media, such as communications links or wireless transmissions containing the program code.

In some illustrative embodiments, program code 218 may be downloaded over a network to persistent storage 208 from another device or data processing system for use within data processing system 200. For instance, program code stored in a computer readable storage medium in a server data processing system may be downloaded over a network from the server to data processing system 200. The data processing system providing program code 218 may be a server computer, a client computer, or some other device capable of storing and transmitting program code 218.

Using data processing system 200 of FIG. 5 as an example, a computer-implemented process for partitioning a crawling space is presented. Controller 204 computes an event identifier for each event in the set of events, in a document object model retrieved from storage devices 216, to form an identified set of events. Controller 204 segments the identified set of events into a number of partitions and assigns a partition to each node in a set of nodes. Controller 204 initiates execution of each event in each assigned partition by a respective node. Responsive to a determination that a new state is discovered, other nodes are notified of the new state by controller 204 using communications unit 210, in which information associated with the new state is added to a respective assigned set of event IDs at each node. Responsive to a determination that no more notifications exist, controller 204 determines whether more events to process exist and responsive to a determination that no more events to process exist, controller 204 terminates the partitioning process.

Figure 6:
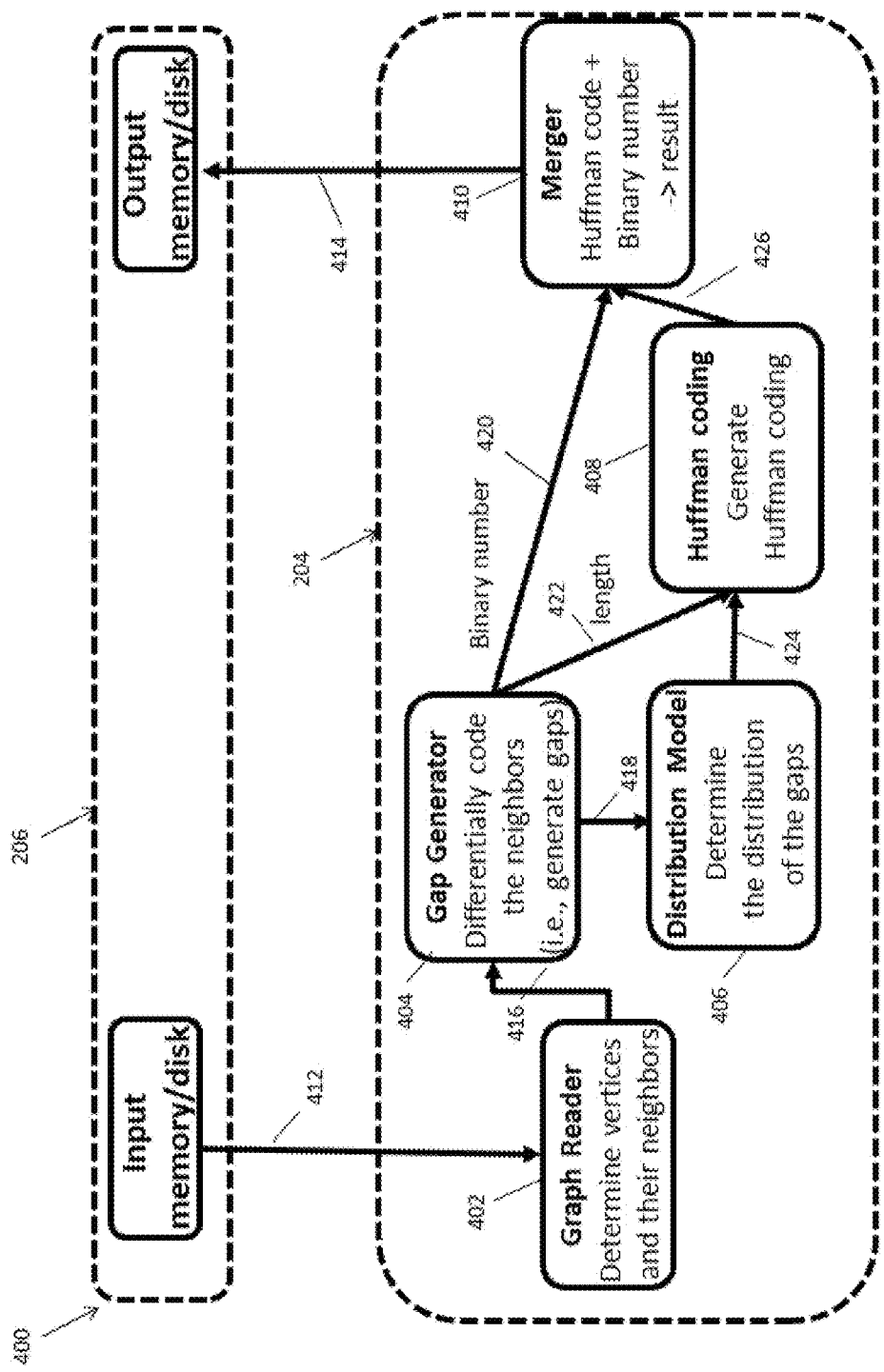
FIG. 6 illustrates a graph compression system that implements an enhanced VLI encoding scheme according to a non-limiting embodiment.

Turning now to FIG. 6, a graph compression system 400 configured to execute an enhanced VLI encoding scheme is illustrated according to a non-limiting embodiment. The graph compression system 400 includes an electronic hardware controller 204 in signal communication with a memory unit 206. The memory unit 206 can be constructed as solid-state drive (SSD) memory, for example, and is configured to store graph data. In at least one embodiment, the graph data is defined by a set of related vertices, and which can be retrieved by the controller 204.

The controller 204 can compress a given graph $|V|$ by compressing each vertex ($V_0 \ldots V_N$) included in a set of vertices defining the graph $|V|$. In at least one embodiment, controller 204 encodes each vertex ($V_N$) as a variable length integer (VLI) that includes a variable number of bytes. Unlike a conventional VLI scheme, however, the controller 204 executes an enhanced VLI scheme which includes determining a distribution of the set of vertices in a graph and computing the variable number of bytes of each vertex ($V_N$) based on the determined distribution. This enhanced VLI scheme is described in greater detail below.

The controller 204 includes one or more hardware processor units configured to execute the enhanced VLI encoding scheme described herein. In at least one embodiment, the controller 204 includes a graph reader processor 402, a gap generator processor 404, a distribution model processor 406, a Huffman code processor 408, and a merger processor 410. Any one of the graph reader processor 402, gap generator processor 404, distribution model processor 406, Huffman code processor 408, and merger processor 410 can be constructed as an independent electronic hardware controller that includes memory and a processor configured to execute algorithms and computer-readable program instructions stored in the memory.

The graph reader processor 402 is in signal communication with the memory unit 206 to receive input graph data 412 corresponding to a selected graph. The graph data can include, for example, web graphs, social networking graphs, etc. The graph reader processor 402 is configured to receive the input graph data 412, and identify each vertex ($V_N$) included in a graph $|V|$ to be compressed, along one or more neighbors ($v_N$) corresponding to each identified vertex ($V_N$) to be compressed. For example, the graph reader processor 402 can generate a graph neighborhood table listing the outward neighbors ($v_0$-$v_N$) of each vertex ($V_0$-$V_N$). A neighbor is referred to one or more vertices ($v_N$) that are directly adjacent to a given vertex ($V_N$).

The gap generator processor 404 is in signal communication with the graph reader processor 402 to receive a signal 416 indicating the total number of vertices ($V_0$-$V_N$) of the graph $|V|$, along with the neighbors ($v_N$) of each vertex ($V_0$-$V_N$). Accordingly, the gap generator processor 404 operates to differentially code each neighbor ($v_N$) included in the neighborhood $|v_N|$ of a given vertex ($V_N$) to be compressed into a series of "gaps". A "gap" is referred to as a differential value between two directly adjacent vertices ($v$) within a given neighborhood $|v_N|$.

Referring back to FIG. 2, for example, vertex 0 ($V_0$) has a neighborhood $|v_0|$, which includes vertices 1, 2, 4, and 5. The degree ($D_0$) of the vertex being compressed ($V_0$) in this example is 4 (i.e., there are four vertices included in $|v_0|$). Because vertex "1" has no preceding neighbor, the gap generator processor 404 would determine a gap code of "1" (the preceding neighbor is initialized as "0"). For vertex "2", the gap generator processor 404 calculates a corresponding gap code of "1" (i.e., 2−1=1). For vertex 4, the gap generator processor 404 calculates a corresponding gap code of "2" (i.e., 4−2=2). For vertex 5, the generator processor 404 calculates a corresponding gap code of "1" (i.e., 5−4=1). Accordingly, the gap list identifying the gaps (G) of the neighborhood $|v_0|$ corresponding to vertex ($V_0$) would be defined as $G(v_0)=\{0, +1, +2, +1\}$.

After computing the gaps (G), the gap generator processor 404 outputs a signal 420 (e.g., a first binary value) indicative of the differential code assigned to each neighbor ($v_N$) of the vertex to be compressed ($V_N$), along with another signal 422 (e.g., a second binary number) indicative of the length of the signal 420. The length of the signal is referred to as the number of binary bits representing the signal. For example, if the output signal 420 indicates a vector value of "9", its binary representation is "$1001_{(2)}$," and the length (signal 422) is "4".

The distribution model processor 406 is in signal communication with the gap generator processor 404 to receive a signal 418 indicating the total number of vertices in the graph $|V|$; and the degree ($D_N$) of the vertex ($V_N$). Accordingly, the distribution model processor 406 can compute a distribution of the gaps determined by the gap generator processor 404. The distribution includes information indicating the frequency at which each length value appears (i.e., frequency table) when a list of gaps from a vertex of a certain $D_N$ and $|V|$ is given. In at least one embodiment, the distribution model processor 406 computes the distribution based on the number of total vertices included in the graph $|V|$ and the degree ($D_N$) of each vertex ($V_N$) to be compressed.

In one example, the distribution model processor 406 stores a statistical model of the distribution of the graph $|V|$. In this manner, the distribution model processor 406 can determine the distribution of each vertex in the neighborhood $|v_N|$ of a vertex to be compressed ($V_N$) as a function of A.) the total number of vertices in the graph $|V|$; and B.) the degree ($D_N$) of the vertex ($V_N$).

In another example, the distribution model processor 406 stores an actually measured distribution of several different sample degrees of a graph $|V|$. Based on the stored measured distribution, the gap generator processor 404 can compute a distribution of the gaps ($G_N$) corresponding to the vertex ($V_N$) being compressed.

The Huffman code processor 408 is in signal communication with the gap generator processor 404 to receive signal 422 indicating encoded length of the neighbors (i.e., the differential gap values) corresponding to the vertex ($V_N$) being compressed, and the distribution model processor 406 to receive a signal 424 indicating the distribution of the gaps ($G_N$). The Huffman code processor 408 then executes a Huffman coding algorithm based on the distribution of the length indicated by signal 422 to determine a prefix length, which is to be applied to the gap code to be compressed. For example, the Huffman coding algorithm utilized by the Huffman code processor 408 can be utilized to generate the prefix length based on the degree of a vertex being encoded. In at least one embodiment, a gap code ($g_0$) having a large distribution or that appears more frequently is assigned a smaller prefix length than a gap code ($g_1$) a smaller distribution or appears less frequently, thereby providing an enhanced VLI encoding scheme that reduces the total storage space needed to store the compressed graph |V| in memory.

The Huffman coding algorithm executed by the Huffman code processor 408 can also include generating Huffman trees based on the degree of the current vertex ($V_N$) being compressed. In this manner, a different Huffman tree can be generated for each vertex ($V_N$) included in the graph |V| to be compressed. Accordingly, the lengths of prefixes generated by the Huffman code processor 408 are not "fixed" according to the binary representation of a given vertex ($V_N$).

The merger processor 410 is in signal communication with the gap generator processor 404 to receive signal 420 indicating the binary representation of the gap (g) of the neighbor to be compressed, and the Huffman code processor 408 to receive signal 426 indicating the prefix to be applied to the binary representation of the gap (g). Accordingly, the merger processor 410 adds the prefix to the beginning of the binary representation to generate a compressed gap ($g_0'$) representing vertex ($V_0$). The compressed vertex data signal 414 representing the compressed vertex ($g_0'$) is then output to the memory unit 206 where it is stored as compressed graph data. The enhanced VLI encoding scheme described above can be repeated until the gaps from all vertices ($V_0$-$V_N$) included in the graph |V| are compressed and stored in memory.

The compressed vertex data 414 generated according to the enhanced VLI scheme described herein consumes less storage area in the memory 206 because, unlike conventional VLI encoding schemes which generates prefix lengths that are based directly on the binary representation of the vertex, the enhanced VLI encoding scheme generates the prefix length according to the distribution and degree of the vertex, regardless of the vertex's binary representation. Accordingly, a vertex having a large binary representation can be assigned a small prefix length if it has a large distribution or appears more frequently than a vertex having a smaller binary representation. Although FIG. 6 illustrates the input graph data 412 and the output merged graph data 414 as being stored in a common memory unit 206, the invention is not limited thereto. For instance, the input graph data 412 can be received from a first memory unit, while the output merged graph data 414 (i.e., compressed graph data) can be stored in a different data storage device or second memory unit located remotely from the first memory unit.

Figure 7:
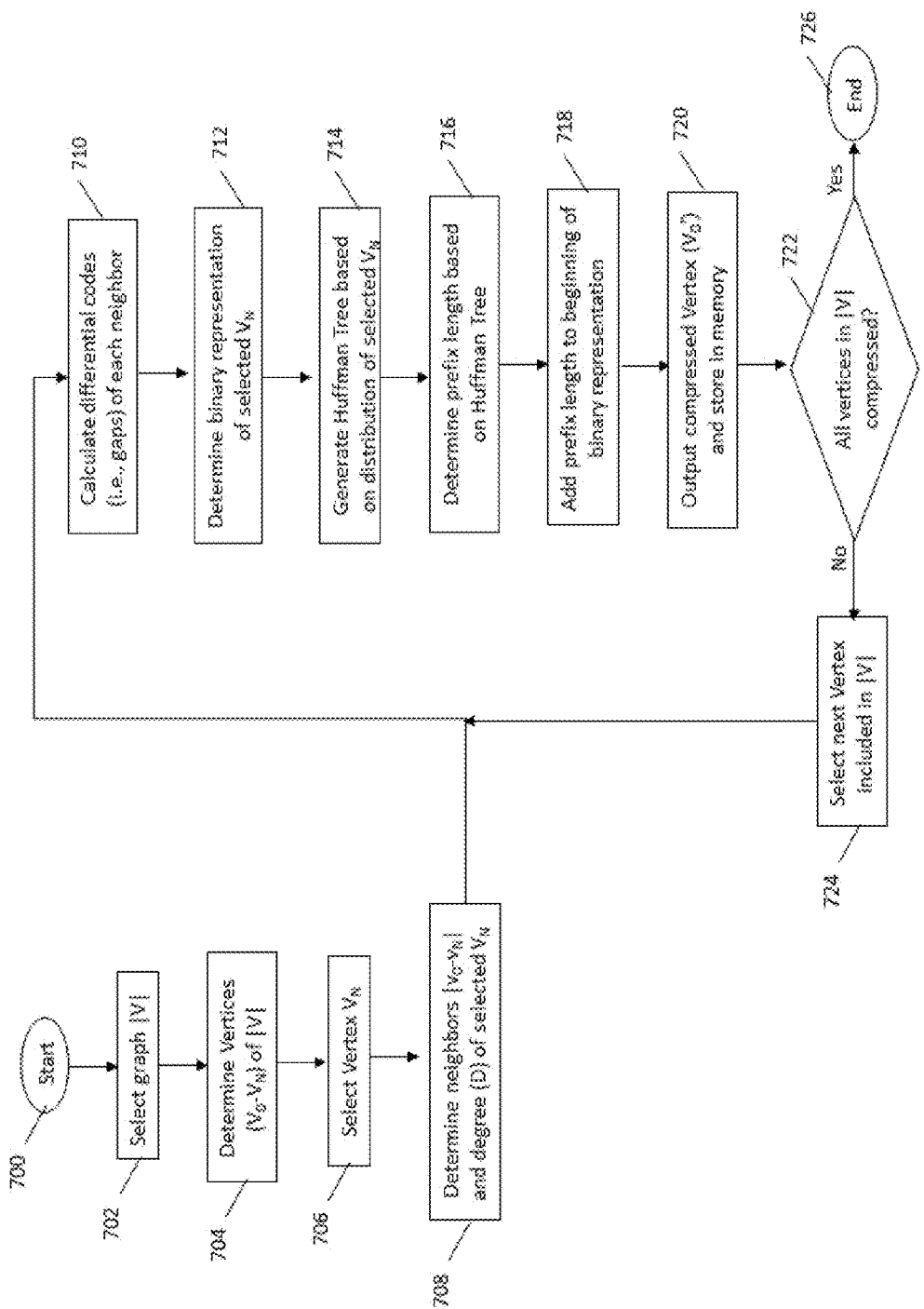
FIG. 7 is flow diagram illustrating an enhanced VLI encoding scheme executed by a graph compression system according to a non-limiting embodiment.

Turning now to FIG. 7, a flow diagram illustrates an enhanced VLI encoding scheme executed by a graph compression system according to a non-limiting embodiment. The method begins at operation 700, and at operation 702 a graph data corresponding to a graph |V| to be compressed is selected from memory. At operation 704, the vertices ($V_0$ . . . $V_N$) of the graph |V| are determined.

A first vertex ($V_N$) to be compressed according to the enhanced VLI scheme is selected at operation 706. At operation 708, the neighbors ($v_0$ . . . $v_N$) of the selected vertex ($V_N$) are determined, which in turn allows for determining the degree ($D_N$) of the selected vertex ($V_N$). At operation 710, differential codes (i.e., gaps) of each neighbor are determined. In at least one embodiment, a gap is calculated as a differential value between a value of a given neighbor vertex and a value of its directly preceding neighboring vertex. At operation 712, a binary representation of the selected vertex ($V_N$) currently being encoded is determined.

Turning to operation 714, a Huffman tree is generated based on the distribution of the selected vertex ($V_N$). In at least one non-limiting embodiment, the distribution of the selected vertex ($V_N$) is based on based on the number of total vertices included in the graph |V| and the degree ($D_N$) of vertex ($V_N$) being compressed. At operation 716, a prefix length is determined based on the Huffman Tree, and the prefix length is merged with binary representation at operation 718. In at least one non-limiting embodiment, the prefix length is added to the beginning of the binary representation to generate a compressed vertex ($V_0'$) representing the selected vertex ($V_0$) (i.e., $V_0$ selected at operation 706). The compressed vertex ($V_0'$) is output (e.g., from the controller 204) and stored in memory 206 at operation 720. At operation 722 a determination is made as to whether all the vertices in the graph |V| have been compressed. If there remains one or more uncompressed vertices, the next vertex included in the graph |V| is selected at operation 724, is encoded according to the enhanced VLI encoding scheme described at operations 710-720 described above. When, however, all the vertices in the graph |V| have been compressed, the method ends at operation 726.

As described herein, one or more embodiments address provide a graph compression system which implements an enhanced VLI encoding scheme that improves large-scale graph compression efficiency. The enhanced VLI scheme takes into account the distribution of vertices to be encoded in order to determine the prefix length added to each vertex included in the graph. Thus, the length of the prefix value is independent of the length of the binary value representing a given vertex. In other words, a vertex represented by a large binary value is not required to have a large prefix length. Accordingly, the compression efficiency of the graph is improved (e.g., 10%-20% improvement) because extraneous bits can be eliminated from the prefix length. In this manner, memory space can be reduced and computing performance speed can be increased.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A graph compression system comprising:
   a memory unit configured to store graph data; and
   an electronic hardware controller in signal communication with the memory unit, the electronic hardware controller configured to determine a distribution of a set of vertices in a graph, and to encode each vertex included in the set of vertices as a variable length integer (VLI) that includes a variable number of bytes,
   wherein the variable number of bytes of each vertex is based on the determined distribution, and
   wherein the memory unit stores each encoded vertex.

2. The graph compression system of claim 1, wherein the determined distribution for a selected vertex among the set of vertices is based on a total number of vertices included in the set and a total number of neighbors of the selected vertex.

3. The graph compression system of claim 2, wherein the variable number of bytes of each vertex includes a binary value representing a respective vertex, and a binary prefix.

4. The graph compression system of claim 3, wherein a prefix length of the binary prefix is calculated independently from a length of the binary value.

5. The graph compression system of claim 4, wherein the prefix length is calculated according to Huffman coding algorithm, the Huffman coding algorithm calculating the prefix length based on a degree of a vertex being encoded.

6. The graph compression system of claim 5, wherein the electronic hardware controller comprises:
a graph reader processor configured to obtain graph data corresponding to a graph to be compressed, to determine each vertex defining the graph, and to determine each neighbor corresponding to each vertex defining the graph;
a gap generator processor configured to apply a differential code to each neighbor, and to output the binary value representing a respective vertex;
a distribution model processor configured to determine the distribution based on differential code applied to each neighbor;
a Huffman code processor configured to execute the Huffman coding algorithm based on the distribution of the differential codes to generate the binary prefix; and
a merger processor configured to merge the binary prefix with the binary value to compress the vertex.

7. The graph compression system of claim 6, wherein the prefix length of a respective binary prefix is determined by a coding length of the differential code corresponding to a respective vertex of the graph such that the length of the prefix length is independent of the binary value.

8. A method of compressing a graph, the method comprising:
determining a distribution of a set of vertices in a graph;
encoding each vertex in the set of vertices defining the graph as a variable length integer (VLI) that includes a variable number of bytes; and
storing each encoded vertex in a memory unit,
wherein the variable number of bytes of each vertex is based on the determined distribution.

9. The method of claim 8, further comprising determining a distribution for a selected vertex among the set of vertices based on a total number of vertices included in the set, and a total number of neighbors of the selected vertex.

10. The method of claim 9, wherein the variable number of bytes of each vertex includes a binary value representing a respective vertex, and a binary prefix.

11. The method of claim 10, further comprising calculating a prefix length of the binary prefix independently from a length of the binary value.

12. The method of claim 11, further comprising generating, via a Huffman coding algorithm the prefix length such that the prefix length is based on a degree of a vertex being encoded.

13. The method of claim 12, wherein encoding each vertex comprises:
selecting the graph to be compressed from the memory unit;
determining each vertex defining the graph;
determining each neighbor corresponding to each vertex;
applying a differential code to each neighbor, and outputting the binary value representing a respective vertex;
determining the distribution based on differential code applied to each neighbor;
executing a Huffman coding algorithm based on the distribution of the differential codes to generate the binary prefix; and
merging the binary prefix with the binary value to compress the vertex.

14. The method of claim 13, wherein determining the prefix length of a respective binary prefix includes:
determining a coding length of the differential code corresponding to a respective vertex; and
generating the binary prefix with a length according to the coding length of the differential code such that the length of the prefix length is independent of the binary value.

15. A computer program product to control an electronic device to compress graph data, the computer program product comprising a computer readable storage medium having program instructions embodied therewith, the program instructions executable by an electronic computer processor to control the electronic device to perform a method comprising:
determining a distribution of a set of vertices in a graph represented by the graph data; and
encoding each vertex in the set of vertices defining the graph as a variable length integer (VLI) that includes a variable number of bytes;
storing each encoded vertex in a memory unit,
wherein the variable number of bytes of each vertex is based on the determined distribution.

16. The computer program product of claim 15, further comprising determining a distribution for a selected vertex among the set of vertices is based on a total number of vertices included in the set and a total number of neighbors of the selected vertex.

17. The computer program product of claim 16, wherein the variable number of bytes of each vertex includes a binary value representing a respective vertex, and a binary prefix.

18. The computer program product of claim 17, further comprising calculating a prefix length of the binary prefix independently from a length of the binary value.

19. The computer program product of claim 18, further comprising generating, via a Huffman coding algorithm, the prefix length such that the prefix length is based on a degree of a vertex being encoded.

20. The computer program product of claim 19, wherein encoding each vertex comprises:
selecting the graph to be compressed from the memory unit;
determining each vertex defining the graph;
determining each neighbor corresponding to each vertex;
applying a differential code to each neighbor, and outputting the binary value representing a respective vertex;
determining the distribution based on differential code applied to each neighbor;
executing a Huffman coding algorithm based on the distribution of the differential codes to generate the binary prefix; and
merging the binary prefix with the binary value to compress the vertex,
wherein determining the prefix length of a respective binary prefix includes:
determining a coding length of the differential code corresponding to a respective vertex; and
generating the binary prefix with a length according to the coding length of the differential code such that the length of the prefix length is independent of the binary value.

* * * * *